(12) United States Patent
Junker et al.

(10) Patent No.: US 7,776,731 B2
(45) Date of Patent: Aug. 17, 2010

(54) METHOD OF REMOVING DEFECTS FROM A DIELECTRIC MATERIAL IN A SEMICONDUCTOR

(75) Inventors: Kurt H. Junker, Austin, TX (US); Tien-Ying Luo, Beacon, NY (US); Dina H. Triyoso, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 412 days.

(21) Appl. No.: 11/855,557

(22) Filed: Sep. 14, 2007

(65) Prior Publication Data

US 2009/0075434 A1    Mar. 19, 2009

(51) Int. Cl.
*H01L 21/3205* (2006.01)

(52) U.S. Cl. .................. 438/591; 438/216; 438/287; 438/585; 438/778; 438/785

(58) Field of Classification Search .............. 438/216, 438/287, 585, 591, 778, 785
See application file for complete search history.

(56) References Cited

U.S. PATENT DOCUMENTS

| | | | |
|---|---|---|---|
| 6,395,650 B1 | 5/2002 | Callegari et al. | |
| 6,740,605 B1 * | 5/2004 | Shiraiwa et al. | 438/795 |
| 6,809,370 B1 | 10/2004 | Colombo et al. | |
| 6,821,873 B2 * | 11/2004 | Visokay et al. | 438/591 |
| 6,897,106 B2 * | 5/2005 | Park et al. | 438/240 |
| 7,015,153 B1 | 3/2006 | Triyoso et al. | |
| 7,094,712 B2 | 8/2006 | Im et al. | |
| 7,135,361 B2 | 11/2006 | Visokay et al. | |
| 7,160,771 B2 | 1/2007 | Chou et al. | |
| 7,165,560 B2 | 1/2007 | Fujii | |
| 2003/0129817 A1 | 7/2003 | Visokay et al. | |
| 2005/0051824 A1 * | 3/2005 | Iizuka et al. | 257/306 |
| 2005/0130442 A1 * | 6/2005 | Visokay et al. | 438/775 |
| 2006/0234517 A1 | 10/2006 | Yeo et al. | |
| 2006/0264066 A1 | 11/2006 | Bartholomew et al. | |

* cited by examiner

*Primary Examiner*—Kevin M Picardat
*Assistant Examiner*—Bac H Au

(57) ABSTRACT

A method of forming a semiconductor device includes forming a high dielectric constant material over a semiconductor substrate, forming a conductive material over the high dielectric constant material, and performing an anneal in a non-oxidizing ambient using ultraviolet radiation to remove defects in the high dielectric constant material. Examples of a non-oxidizing ambient include for example nitrogen, deuterium, a deuterated forming gas ($N_2/D_2$), helium, argon or a combination of any two or more of these. Additional anneals using ultraviolet radiation may be performed. These additional anneals may occur in non-oxidizing or oxidizing ambients.

20 Claims, 3 Drawing Sheets

METHOD OF REMOVING DEFECTS FROM A DIELECTRIC MATERIAL IN A SEMICONDUCTOR

BACKGROUND

1. Field

This disclosure relates generally to semiconductors, and more specifically, to methods for removing defects from an insulator in a semiconductor device.

2. Related Art

Semiconductor devices are frequently made by incorporating one or more dielectric or electrically insulating layers of material. For example, transistors and capacitors each have at least one insulating layer used to electrically separate materials that are either electrically conductive or semi-conductive. As semiconductors improved the materials used for these insulating layers have also improved with respect to their insulating properties. A category of insulators developed in the industry and are known as "high-K dielectrics" or high-K films because these insulators have very high dielectric permittivity and a high dielectric constant. This category of dielectric replaces silicon dioxide which is a commonly implemented semiconductor dielectric. Current high-K materials, such as hafnium-based oxides, are deposited with an inherent number of crystalline and charge defects that act as charge traps. High-K films that are metal oxides are generally not stable under subsequent processing conditions at high temperatures when deposited on silicon or silicon dioxide. They typically react with underlying materials and the electrode materials to form oxide and silicate phases that do not have the desired dielectric properties. These defects in the form of charge traps limit the semiconductor device's performance through increased current leakage and therefore degrade device reliability. For example the increased current leakage directly results in an increase in power consumption.

Others have removed defects from high-K dielectric films by subjecting an exposed surface of the dielectric film to an ultraviolet (UV) radiation source in the presence of an oxygen-rich ambient. The oxygen in the ambient combines with defects in the high-K dielectric, such as dangling bonds, to treat or cure the defects. However, such treatment is not ideal because subsequent processing is required. When an additional material is placed on the dielectric and when subsequent high temperature anneals are performed, new defects are introduced into the dielectric film.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
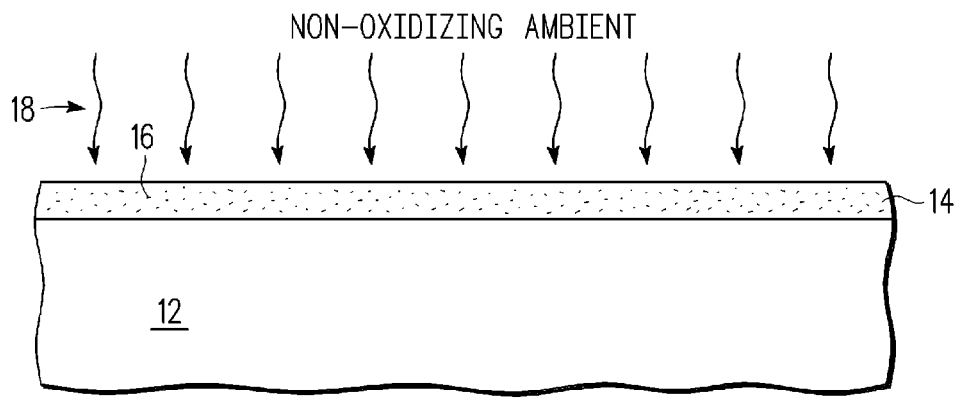
FIGS. 1-4 illustrate in cross-sectional form a method of making a semiconductor device in accordance with one form of the present invention.

Illustrated in FIG. 1 is a semiconductor device 10 that is formed in accordance with one form of the various methods described herein. A semiconductor substrate 12 is provided. The semiconductor substrate 12 in one form is single crystalline silicon. In another form the semiconductor substrate 12 may be any of various other semiconductor materials such as silicon germanium for example. A layer of a high-K dielectric 14 is formed overlying and in contact with the semiconductor substrate 12. For purposes of this discussion, a high-K dielectric is defined as a dielectric having a permittivity that is greater than the permittivity of silicon dioxide. The high-K dielectric 14 may be any of well known high-K dielectric materials, as well as other types of high permittivity materials that are not presently known. Due to reactions of the high-K dielectric 14 with the underlying semiconductor substrate 12, oxide and silicate phases are formed within the high-K dielectric 14 that do not have the desired dielectric properties. These defects result in defects such as defect 16. The defects may take various forms. For example, the defects may be the presence of carbon atoms or may be a dangling bond in the chemical composition of the high-K dielectric 14. A dangling bond creates a trap for electric charge to collect. In order to remove the defects within the high-K dielectric 14, the high-K dielectric 14 is directly exposed to ultraviolet radiation 18 in a non-oxidizing ambient. The non-oxidizing ambient is, in one form, a nitrogen ($N_2$) ambient. In other forms the non-oxidizing ambient may be either deuterium, a deuterated forming gas ($N_2/D_2$), helium, argon or a combination of any two or more of these. Because the non-oxidizing ambient does not contain any oxygen, there is no oxidation of the layer underneath the high-K dielectric 14. Any oxidation of the layer underneath the high-K dielectric 14 is undesirable as it could degrade the characteristics of the high-K dielectric 14 devices. The exposure to ultraviolet radiation 18 may be implemented using any temperature within a range of temperatures. Typically a temperature within the range of 300 to 525 degrees Centigrade may be implemented. However, depending upon the type of semiconductor device being formed, other temperatures which are higher may also be implemented.

To expose semiconductor device 10 and its high-K dielectric 14 to ultraviolet radiation, an exposure chamber (not shown) is used. Conventional exposure chambers have a substrate support which is moveable between a released position distal or situated away from an exposure source and a lifted position proximate to the exposure source. The substrate support supports semiconductor device 10 in the chamber. During insertion and removal of the semiconductor device 10 from the exposure chamber, the substrate support may be moved to a loading position, and thereafter, during exposure of the semiconductor device 10, the support may be raised into the lifted position to maximize exposure levels. Conventional chambers include a heater, such as a resistive element or a radiating heat source, which may be used to heat the semiconductor device 10 to a desired temperature during exposure. A gas inlet introduces a gas into the exposure chamber, and a gas outlet is provided to exhaust the gas from the exposure chamber.

Conventional exposure chambers further include an exposure source that provides a suitable energy beam, such as ultraviolet radiation or electron beams. If the exposure source is a UV radiation source, the UV radiation source may be a suitable ultraviolet radiation source that can emit a single ultraviolet wavelength, or a broadband of ultraviolet wavelengths. A suitable single wavelength ultraviolet source may be an excimer ultraviolet source that provides a single ultraviolet wavelength of 172 nm or 222 nm. A suitable broadband source may be utilized which is adapted to generate ultraviolet radiation having wavelengths of from about 200 to about 400 nm.

The high-K dielectric 14 may be exposed to ultraviolet radiation having other wavelengths that are generated by lamps containing gases that radiate at specific wavelengths when electrically stimulated. For example, suitable ultraviolet lamps may comprise Xe gas, which generates ultraviolet radiation having a wavelength of 172 nm. In other embodiments, the lamp may comprise other gases having different corresponding wavelengths. Thus, for example, mercury lamps radiate at a wavelength of 243 nm, deuterium lamps radiate at a wavelength of 140 nm, and $KrCl_2$ lamps radiate at a wavelength of 222 nm.

Generation of ultraviolet radiation specifically tailored to modify the properties of the high-K dielectric 14 material may also be accomplished by introducing a mixture of gases into the lamp, each gas capable of emitting radiation of a characteristic wavelength upon excitation. By varying the relative concentration of the gases, the wavelength content of the output from the radiation source can be selected to simultaneously expose all of the desired wavelengths, thus minimizing the necessary exposure time. The wavelength and intensity of the ultraviolet radiation can be selected to obtain predetermined or ideal properties of the high-K material.

A deposition chamber (not shown) and exposure chamber (not shown) may also be integrated together on a multi-chamber process platform (not shown) served by a single robotic arm. The deposition chamber may be any of a CVD (chemical vapor deposition) chamber, an ALD (atomic layer deposition) chamber, a PVD (physical vapor deposition) chamber or other forms of deposition that is appropriate for high-K dielectric deposition. The exposure source and the support of the exposure chamber, and the components of the deposition chamber that include the substrate support, motor, valves or flow controllers, gas delivery system, throttle valve, power supply, and heater, and the robotic arm of the integrated processing system, may all be controlled by a system controller over suitable control lines. The system controller relies on feedback from optical sensors to determine the position of movable mechanical assemblies such as the throttle valve and substrate support which are moved by appropriate motors under the control of the controller.

For exposure treatment in the described exposure chamber, semiconductor device 10 is inserted into an exposure chamber and placed upon the substrate support in a lowered position. The substrate support is then raised to a lifted position, the optional heater in the support powered on, and the exposure source is activated. During exposure, a gas such as helium or nitrogen may be circulated through the exposure chamber to improve thermal heat transfer rates between the substrate and the support. Other gases may also be used. After a period of radiation exposure, the exposure source is deactivated and the substrate support is lowered back into the released position. The substrate bearing the exposed high-K dielectric is then removed from the exposure chamber.

Figure 2:
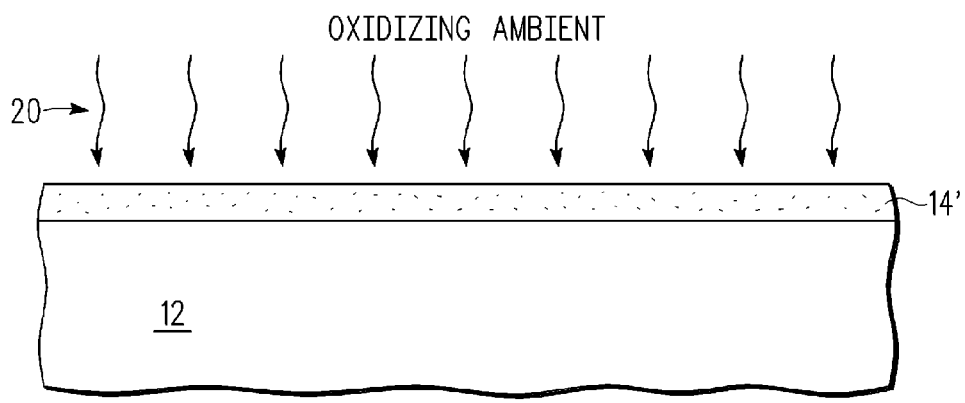

Illustrated in FIG. 2 is further treatment of the high-K dielectric 14 of FIG. 1. In particular, the non-oxidizing ambient of FIG. 1 has significantly reduced the number of defects within the high-K dielectric 14 to provide a modified high-K dielectric 14'. However, a small number of defects may remain. Therefore, in an optional step, exposure of the high-K dielectric 14' to ultraviolet radiation 20 in an oxidizing ambient may be implemented in an optimal way to avoid oxide thickness increase at the substrate/high-K dielectric interface. Examples of ambients that are oxidizing ambients include ambients containing oxygen ($O_2$), nitrous oxide ($N_2O$), ozone ($O_3$), water ($H_2O$), deuterated or heavy water ($D_2O$). The ultraviolet radiation 20 may be implemented within a relatively wide range of temperatures depending upon whether other portions of semiconductor device 10 have received a significant amount of prior processing. Thus any temperature within a range that is from approximately 300 degrees Centigrade to 800 degrees Centigrade is appropriate. It should be understood that higher temperatures may however be implemented in some applications. The result of the ultraviolet exposure of the high-K dielectric 14' of FIG. 2 in an oxidizing ambient is further removal of defects to create a much more ideal high-K dielectric 14" illustrated in FIG. 3.

Figure 3:
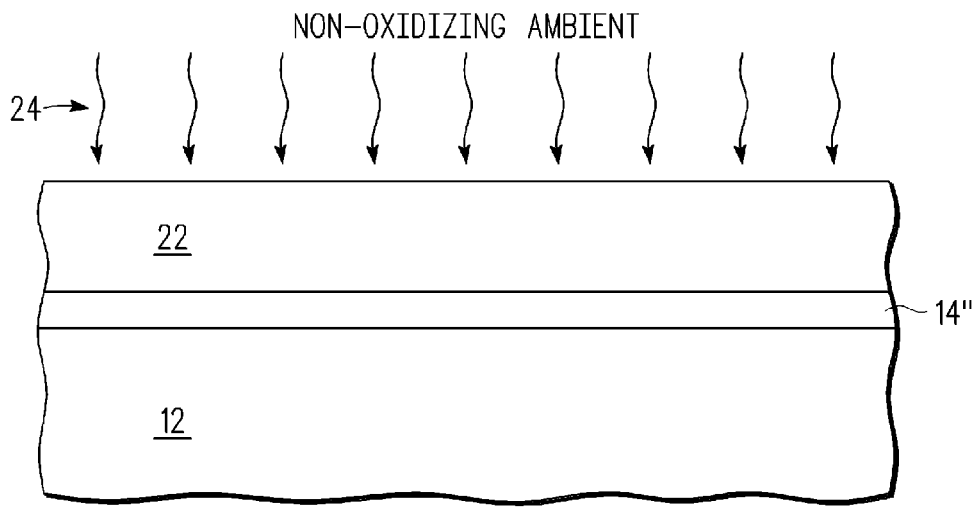

FIG. 3 illustrates further processing of semiconductor device 10 including additional treatment of the high-K dielectric 14' of FIG. 2 to remove defects introduced at the interface with a newly formed material. In particular, a non-insulating layer in the form of a metal layer 22 is formed overlying the high-K dielectric 14' of FIG. 2. As a direct result of the physical contact of the metal layer 22 with high-K dielectric 14' there are new defects introduced into the high-K dielectric 14'. At this point in the processing there is no exposed surface of high-K dielectric 14' to permit a conventional ultraviolet radiation in an oxidizing ambient. Even if there was a trench or opening within the metal layer 22 to expose a portion of the high-K dielectric 14', an ultraviolet radiation of the metal layer 22 in an oxidizing ambient would cause an undesired modification of metal layer 22 by oxidizing the metal layer 22. Instead, an ultraviolet radiation of the metal layer 22 in a non-oxidizing ambient is performed. The energy associated with the ultraviolet radiation of metal layer 22 functions to cure or remove the defects within high-K dielectric 14' which becomes an improved high-K dielectric 14". Further, since the ultraviolet radiation is performed in a non-oxidizing ambient, this is an inert or non-reactive environment with the metal layer 22. The ultraviolet radiation of semiconductor device 10 in FIG. 3 is performed at a temperature which is generally within the range of temperatures described in connection with the ultraviolet radiation of FIG. 1. In other words a temperature generally in the range of 300 to 525 degrees Centigrade may be used with the understanding that a temperature outside of this range may be used depending upon the type of material for metal layer 22 and the particular circuit being formed.

Figure 4:
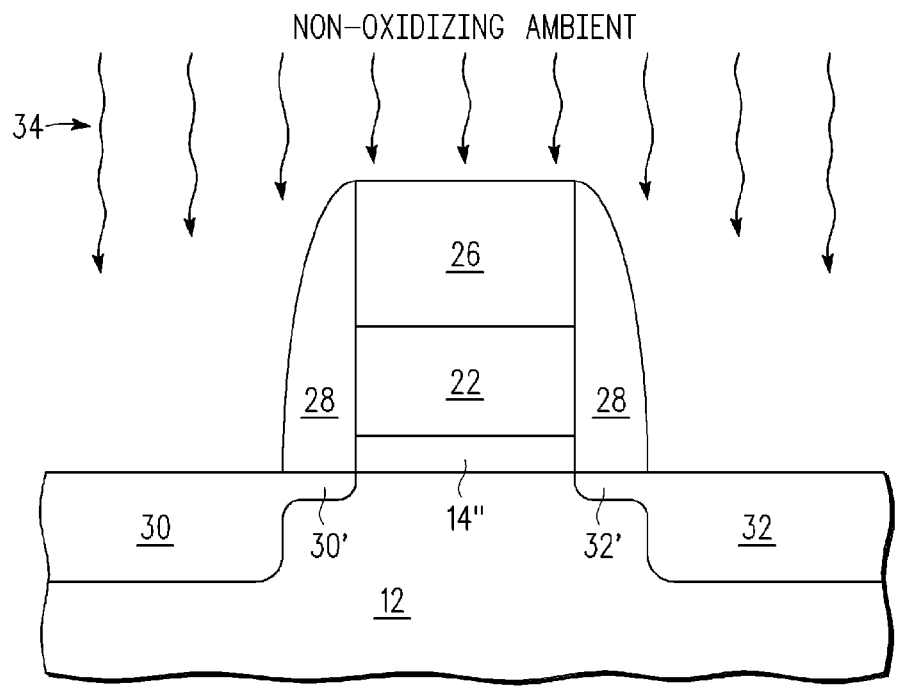

Illustrated in FIG. 4 is one example of how the structure illustrated in FIGS. 1-3 may be utilized. In one form the semiconductor device 10 may be further processed to form a transistor. Overlying the metal layer 22 is a non-insulating material that is polysilicon layer 26. The polysilicon layer 26 is blanket deposited and patterned to overlie only the metal layer 22. The combination of metal layer 22 and polysilicon layer 26 forms a gate of a transistor. Adjacent the gate and high-K dielectric 14" is a sidewall spacer 28 that is formed by depositing, for example, silicon nitride or silicon dioxide and etching to form a conventional sidewall spacer. Prior to formation of sidewall spacer 28 a source extension 30' and a drain extension 32' are formed within the semiconductor substrate 12 by a conventional ion implant. After completion of the sidewall spacer 28, a source 30 and a drain 32 are formed with additional ion implantation in a conventional manner to form the structure of the source and the drain substantially as illustrated in FIG. 4. At this point in the processing there has been formed a conventional transistor structure. However, due to the physical interaction of sidewall spacer 28 with the side surfaces of the high-K dielectric 14", new defects are again introduced into the high-K dielectric 14". Also high processing temperatures associated with the formation of the source 30, drain 32, sidewall spacer 28 and polysilicon layer 26 can generate additional defects within the high-K dielectric 14". Note that at this point the high-K dielectric 14" is totally enclosed with surrounding semiconductor materials and has no exposed surfaces, either horizontal or vertical. A conventional ultraviolet radiation of the semiconductor device 10 in an oxidizing ambient will therefore not reach the high-K dielectric 14" and cure the defects. Instead, an ultraviolet radiation of the semiconductor device 10 in a non-oxidizing ambient is performed at a temperature substantially within a range of 300 to 525 degrees is performed. The radiation energy of the ultraviolet source, while not directly hitting the high-K dielectric 14", does indirectly reach the high-K dielectric 14" as modifies the high-K dielectric 14" to cure the defects that were introduced. Because the temperature of the ultraviolet radiation step is relatively low, no significant impact on the implantation of the source 30 and the drain 32 occurs. In one form the non-oxidizing ambient is an ambient containing any one of nitrogen, deuterium, helium, argon or a combination of any two or more of these.

Figure 5:
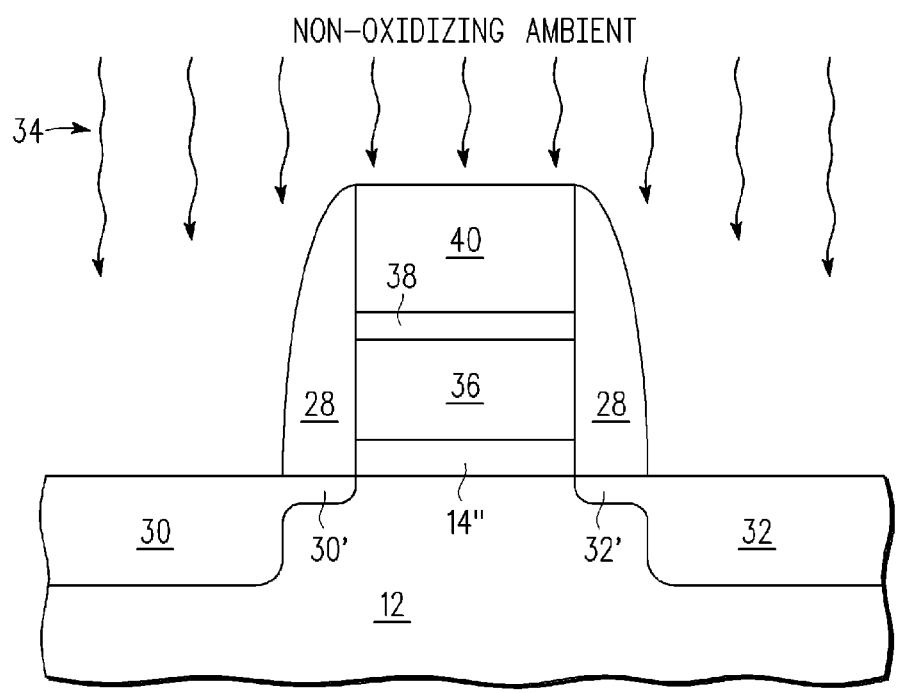
FIG. 5 illustrates in cross-sectional form another semiconductor device made in accordance with another form of the present invention.

Illustrated in FIG. 5 is another semiconductor device 10' that uses the processing of FIGS. 1-3 wherein metal layer 22 is analogous to element 36 of FIG. 5. The semiconductor device 10' implements a nonvolatile memory (NVM) transistor cell. For convenience of explanation, elements of the NVM transistor cell of FIG. 5 that are analogous with the elements of the transistor of FIG. 4 are given the same reference number. In contrast, above the high-K dielectric 14" is a floating gate 36. The floating gate 36 is formed of a non-insulating material and may therefore be any of numerous materials. In one form the floating gate 36 is polysilicon. Floating gate 36 may however contain metal as an alternative. Above the floating gate 36 is a dielectric layer 38 which functions as an insulator. Various insulating materials may be used as the dielectric layer 38. In one form the dielectric layer 38 is formed of a tunnel dielectric such as ONO (an oxide-nitride-oxide stack). However, other forms of insulating materials may be used including a high-K dielectric. Immediately above the dielectric layer 38 is a control gate 40. The control gate is also a non-insulating material and may therefore be any of a number of materials. Thus semiconductor device 10' is a dual gate transistor in which floating gate 36 functions as a storage gate and the control gate 40 functions as a select gate. When forming the sidewall spacer 28 and in the process of completing the processing for semiconductor device 10', the high-K dielectric 14" is modified and contains defects such as dangling chemical bonds. As with the completed transistor of semiconductor device 10, the high-K dielectric 14" has no exposed surfaces. To overcome the problem of defects, semiconductor device 10' is exposed to ultraviolet radiation 34 in a non-oxidizing ambient. Examples of non-oxidizing ambients include for example nitrogen, deuterium, a deuterated forming gas ($N_2/D_2$), helium, argon or a combination of any two or more of these. The temperature of the ultraviolet radiation exposure is a temperature preferable somewhere in the range of 300 to 525 degrees Centigrade or higher depending upon the application. The temperature during the ultraviolet radiation process is low enough to not negatively modify the source/drain implants or otherwise negatively modify the electrical properties of semiconductor device 10'. It should also be understood that if there are defects in the dielectric layer 38 that is between floating gate 36 and control gate 40, the ultraviolet radiation 34 also cures defects in the dielectric layer 38. Thus, a cure of the defects in a high-K dielectric layer may be implemented late in the processing of a dual-gate transistor for use as an NVM cell.

Figure 6:
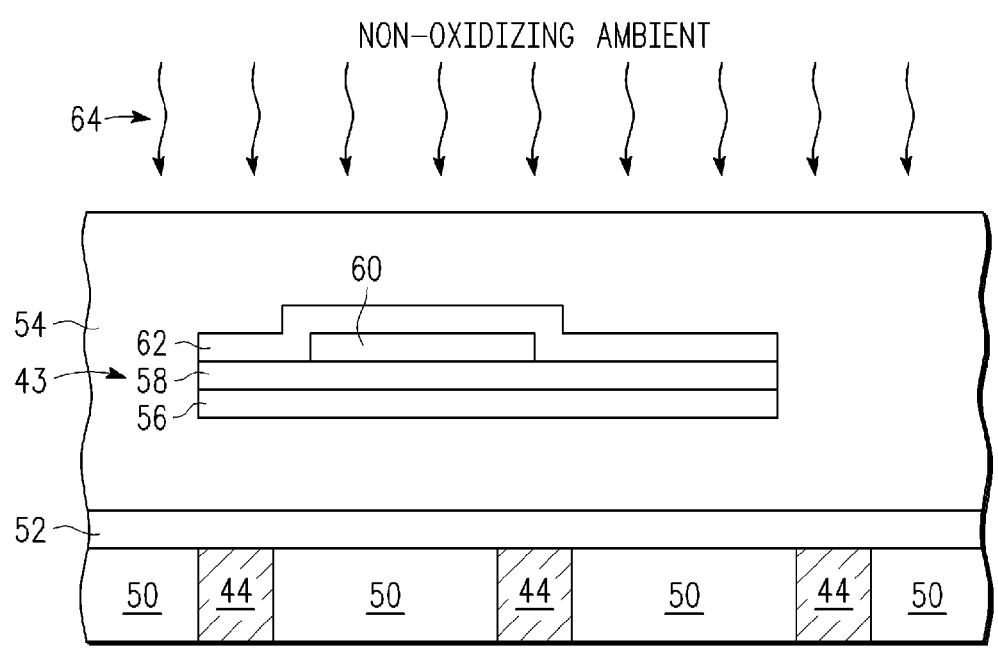
FIG. 6 illustrates in cross-sectional form yet another semiconductor device made in accordance with another form of the present invention.

Illustrated in FIG. 6 is a semiconductor device 42 which contains a capacitor 43. The semiconductor device 42 further illustrates the versatility of the processing illustrated in FIG. 3 to cure an unexposed high-K dielectric layer. The semiconductor device 42 has an interlevel dielectric (ILD) 50 having a plurality of openings or trenches. Within each trench is a conductive material 44. In one form the conductive material 44 is copper but may be any of numerous other semiconductor conductors. Overlying the interlevel dielectric 50 is a passivation layer 52 which is intended to function as an etch stop layer for subsequent processing steps that involve etching. The passivation layer 52 may be any of numerous known passivating materials including silicon nitride, silicon carbon nitrogen or silicon carbon. Overlying the passivation layer 52 is an insulating layer 54. The insulating layer 54 may be implemented with any of known interlevel dielectric materials such as an oxide. Within the insulating layer 54 is capacitor 43. Capacitor 43 has a patterned bottom electrode 56. In one form the bottom electrode 56 is a metal such as tantalum nitride (TaN) or titanium nitride (TiN). However these materials are identified by way of example only and the bottom electrode 56 may be any conductive material, including other metals. Overlying the bottom electrode 56 is a high-K dielectric layer 58. The high-K dielectric layer 58 may be formed of any high-K material. Overlying the high-K dielectric layer 58 is a top electrode 60. The top electrode 60 may also be any conductive material, such as copper. Overlying the top electrode 60 is an etch stop layer 62 which is useful in subsequent processing. The etch stop layer 62 may be implemented with any of numerous materials. In one form the etch stop layer 62 is silicon nitride (SiN). Thus there has been provided a metal-insulator-metal (MIM) structure in the form of capacitor 43. The processing that is used to create capacitor 43 causes defects to form within the high-K dielectric layer 58. To overcome the problem of defects, semiconductor device 42 is exposed to an ultraviolet radiation in a non-oxidizing ambient such as in nitrogen, deuterium, helium, argon or a combination thereof at a temperature preferable somewhere in the range of 200 to 425 degrees Centigrade, depending upon the particular application. For example, if copper is present elsewhere in the integrated circuit, the temperature associated with the ultraviolet radiation should not exceed 400 degrees Centigrade. The temperature during the ultraviolet radiation process is low enough to not negatively modify the conductive interconnects or otherwise negatively modify the electrical properties of semiconductor device 42. Thus, a cure of the defects in a high-K dielectric layer may be implemented late in the processing of a MIM structure for use as a capacitor.

It should be understood that the methods used to form the capacitor 43 of semiconductor device 42 may vary. For example, in an alternative form when the high-K dielectric layer 58 is first formed, the exposed dielectric layer 58 may be subjected to the two ultraviolet radiation treatments of FIG. 1 and FIG. 2 in both a non-oxidizing ambient and an oxidizing ambient. A third ultraviolet radiation treatment similar to that of FIG. 3 and in a non-oxidizing ambient may then be performed as a final cure of the high-K dielectric layer 58 after the formation of the top electrode 60, the etch stop layer 62 and the insulating layer 54.

By now it should be appreciated that there has been provided various methods for removing defects, such as chemical dangling bonds and other altered crystalline conditions, from a dielectric material used in a semiconductor device. The methods discussed herein repair the defects and thereby decrease the current leakage that would otherwise occur through the dielectric material. Because the ultraviolet radiation may be implemented at temperatures that are low enough to avoid affecting existing structures other than the dielectric being cured, minimal impact on the electrical and structural characteristics of such structure occurs.

In one form there is herein provided a method of forming a semiconductor device by forming a high dielectric constant material over a semiconductor substrate. A conductive material is formed overlying the high dielectric constant material. A first anneal is performed in a non-oxidizing ambient using ultraviolet radiation to remove defects in the high dielectric constant material. In another form the conductive material is patterned. Performing the first anneal occurs after patterning the conductive material. In one form the forming of a semiconductor device is the forming of a capacitor. In another form a non-insulating material is formed over the conductive material. The non-insulating material is patterned and the first anneal occurs after patterning the non-insulating material. In another form a spacer is formed adjacent the conductive material and the first anneal occurs after forming the spacer. In yet another form the device that is formed is one of a metal-oxide-semiconductor field effect transistor or a non-volatile memory device. In yet another form a second anneal is performed in a non-oxidizing ambient using ultraviolet radiation before forming the conductive material. In yet another form a third anneal is performed in an oxidizing ambient using ultraviolet radiation after performing the second anneal and before forming the conductive material.

In yet another form there is provided a method of forming a semiconductor device by forming a high dielectric constant material over a semiconductor substrate. A first anneal of the high dielectric constant material is performed wherein the first anneal occurs in a first non-oxidizing ambient using ultraviolet radiation. A non-insulating layer is formed over the high dielectric constant material after performing the first anneal. A second anneal of the high dielectric constant material is performed after forming the non-insulating layer, wherein the second anneal occurs in a second non-oxidizing ambient using ultraviolet radiation. In another form the first non-oxidizing ambient is one of nitrogen, deuterium, helium, and argon and the second non-oxidizing ambient is one of nitrogen, deuterium, helium, and argon. In another form the high dielectric constant material and the non-insulating layer are patterned and the second anneal occurs after patterning the high dielectric constant material and the non-insulating layer. In yet another form a spacer is formed adjacent the non-insulating layer, and the second anneal occurs after forming the spacer. In yet another form a third anneal of the high dielectric constant material is performed before forming the non-insulating layer, wherein the third anneal occurs in an oxidizing ambient using ultraviolet radiation. In another form the non-insulating layer is formed by forming at least a portion of a gate electrode and the high dielectric constant material is formed by forming a gate dielectric. In yet another form the non-insulating layer is formed by forming a control electrode. The high dielectric constant material is one form is a tunnel dielectric. In another form the non-insulating layer is formed by forming a floating gate and the high dielectric constant material is formed by forming a gate dielectric. In another form the non-insulating layer is formed by forming a top electrode and the high dielectric constant material is formed by forming a capacitor dielectric.

In yet another form there is provided a method of forming a semiconductor device by forming a high dielectric constant material over a semiconductor substrate. At least one layer is formed over the high dielectric constant material to form an unexposed high dielectric constant material. A first anneal of the unexposed high dielectric constant material is performed, wherein the first anneal occurs in a first non-oxidizing ambient using ultraviolet radiation. A second anneal of the high dielectric constant material is performed in a second non-oxidizing ambient using ultraviolet radiation, wherein the second anneal occurs before forming the at least one layer over the high dielectric constant material. A third anneal of the high dielectric constant material is performed in an oxidizing ambient using ultraviolet radiation, wherein the third anneal occurs before forming the at least one layer over the high dielectric constant material. In another embodiment the at least one layer is formed by forming a non-insulating layer over the high dielectric constant material. A spacer is formed adjacent the non-insulating layer.

Although the invention has been described with respect to specific conductivity types or polarity of potentials, skilled artisans appreciated that conductivity types and polarities of potentials may be reversed. Moreover, the terms "front," "back," "top," "bottom," "over," "under", "above", "below" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, any semiconductor structure that utilizes a dielectric layer that is prone to experiencing crystalline damage during processing may utilize the methods described herein. While temperature ranges described herein are tailored for specific materials, such ranges may be used for various materials or may be varied in response to the use of different materials or semiconductor structures other than a MIM capacitor, a transistor or a memory cell. Specific non-reactive ambients that avoid oxidation of other materials are described. However, other non-reactive ambient compositions that do not oxidize may be used.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A method of forming a semiconductor device, the method comprising:

forming a high dielectric constant material over a semiconductor substrate;

forming a conductive material over the high dielectric constant material; and forming a non-insulating material over the conductive material;

patterning the non-insulating material; and performing a first anneal in a non-oxidizing ambient using ultraviolet radiation to remove defects in the high dielectric constant material, wherein performing the first anneal occurs after patterning the non-insulating material.

2. The method of claim 1, further comprising:

patterning the conductive material; and wherein performing the first anneal occurs after patterning the conductive material.

3. The method of claim 2, wherein the method of forming a semiconductor device comprises a method of forming a capacitor.

4. The method of claim 1, further comprising:

performing a second anneal in a non-oxidizing ambient using ultraviolet radiation before forming the conductive material.

5. The method of claim 4, further comprising:

forming a spacer adjacent the conductive material; and wherein the first anneal occurs after forming the spacer.

6. The method of claim 5, wherein the method of forming a semiconductor device comprises a method of forming a device selected from the group consisting of a metal-oxide-semiconductor field effect transistor and a non-volatile memory device.

7. A method of forming a semiconductor device, the method comprising:

forming a high dielectric constant material over a semiconductor substrate;

forming a conductive material over the high dielectric constant material;

performing a first anneal in a non-oxidizing ambient using ultraviolet radiation to remove defects in the high dielectric constant material; and performing a second anneal in a non-oxidizing ambient using ultraviolet radiation before forming the conductive material.

8. The method of claim 7, further comprising performing a third anneal in an oxidizing ambient using ultraviolet radiation after performing the second anneal and before forming the conductive material.

9. A method of forming a semiconductor device, the method comprising:

forming a high dielectric constant material over a semiconductor substrate;

performing a first anneal of the high dielectric constant material, wherein the first anneal occurs in a first non-oxidizing ambient using ultraviolet radiation;

forming a non-insulating layer over the high dielectric constant material after performing the first anneal; and performing a second anneal of the high dielectric constant material after forming the non-insulating layer, wherein the second anneal occurs in a second non-oxidizing ambient using ultraviolet radiation.

10. The method of claim 9, wherein the first non-oxidizing ambient comprises an element selected from the group consisting of nitrogen, deuterium, helium, and argon and wherein the second non-oxidizing ambient comprise an element selected from the group consisting of nitrogen, deuterium, helium, and argon.

11. The method of claim 9, further comprising:

patterning the high dielectric constant material and the non-insulating layer; and wherein the second anneal occurs after patterning the high dielectric constant material and the non-insulating layer.

12. The method of claim 9, further comprising:

forming a spacer adjacent the non-insulating layer, and wherein performing the second anneal occurs after forming the spacer.

13. The method of claim 9, further comprising:

performing a third anneal of the high dielectric constant material before forming the non-insulating layer, wherein the third anneal occurs in an oxidizing ambient using ultraviolet radiation.

14. The method of claim 9, wherein forming the non-insulating layer further comprises forming at least a portion of a gate electrode and forming the high dielectric constant material comprises forming a gate dielectric.

15. The method of claim 9, wherein:

forming the non-insulating layer further comprises forming a control electrode; and forming the high dielectric constant material comprises forming a tunnel dielectric.

16. The method of claim 9, wherein:

forming the non-insulating layer further comprises forming a floating gate; and forming the high dielectric constant material comprises forming a gate dielectric.

17. The method of claim 9, wherein:

forming the non-insulating layer further comprises forming a top electrode; and forming the high dielectric constant material comprises forming a capacitor dielectric.

18. A method of forming a semiconductor device, the method comprising:

forming a high dielectric constant material over a semiconductor substrate;

forming at least one layer over the high dielectric constant material to form an unexposed high dielectric constant material by forming a non-insulating layer over the high dielectric constant material and forming a spacer adjacent the non-insulating layer; and performing a first anneal of the unexposed high dielectric constant material, wherein the first anneal occurs in a first non-oxidizing ambient using ultraviolet radiation.

19. The method of claim 18, further comprising:

performing a second anneal of the high dielectric constant material in a second non-oxidizing ambient using ultraviolet radiation, wherein the second anneal occurs before forming the at least one layer over the high dielectric constant material; and performing a third anneal of the high dielectric constant material in an oxidizing ambient using ultraviolet radiation, wherein the third anneal occurs before forming the at least one layer over the high dielectric constant material.

20. The method of claim 18, wherein forming the at least one layer further comprises:

patterning the at least one layer wherein performing the first anneal occurs after patterning the at least one layer.

* * * * *